(12) United States Patent
Liu et al.

(10) Patent No.: US 11,961,848 B2
(45) Date of Patent: Apr. 16, 2024

(54) DISPLAY SUBSTRATE AND MANUFACTURING METHOD THEREFOR, AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Jun Liu, Beijing (CN); Liangchen Yan, Beijing (CN); Bin Zhou, Beijing (CN); Yadong Liang, Beijing (CN); Ning Liu, Beijing (CN); Leilei Cheng, Beijing (CN); Jingang Fang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 602 days.

(21) Appl. No.: 17/265,789

(22) PCT Filed: May 14, 2020

(86) PCT No.: PCT/CN2020/090315
§ 371 (c)(1),
(2) Date: Feb. 3, 2021

(87) PCT Pub. No.: WO2020/238640
PCT Pub. Date: Dec. 3, 2020

(65) Prior Publication Data
US 2021/0167098 A1 Jun. 3, 2021

(30) Foreign Application Priority Data
May 31, 2019 (CN) .......................... 201910468906.9

(51) Int. Cl.
*H01L 27/12* (2006.01)
*H01L 21/02* (2006.01)
(Continued)

(52) U.S. Cl.
CPC ........ *H01L 27/1248* (2013.01); *H01L 27/124* (2013.01); *H01L 27/127* (2013.01);
(Continued)

(58) Field of Classification Search
CPC .................................................. H01L 27/1248
See application file for complete search history.

(56) References Cited

U.S. PATENT DOCUMENTS

| 5,359,206 A | 10/1994 | Yamamoto et al. |
| 5,877,083 A | 3/1999 | Yamazaki |
| 2003/0202267 A1 | 10/2003 | Yamasaki et al. |
| 2005/0173732 A1 | 8/2005 | Yu et al. |

(Continued)

FOREIGN PATENT DOCUMENTS

| CN | 1447153 A | 10/2003 |
| CN | 1615452 A | 5/2005 |

(Continued)

OTHER PUBLICATIONS

CN201910468906.9 First Office Action.
CN201910468906.9 Second Office Action.

*Primary Examiner* — Douglas M Menz
(74) *Attorney, Agent, or Firm* — IPro, PLLC

(57) ABSTRACT

Disclosed are a display substrate and a manufacturing method therefor, and a display device. The display substrate comprises: a substrate base, and an active layer, a gate insulating layer, a first metal film layer, an interlayer insulating layer, a second metal film layer, and a passivation layer stacked in sequence on the substrate base. The first metal film layer comprises a pattern of a gate and a gate line. The second metal film layer comprises a pattern of a
(Continued)

source/drain and a data line. The gate line and the data line are partially arranged opposite to each other. An oxide metal layer is provided on the surface of the side of the region of the gate line opposite to the data line facing the data line.

10 Claims, 9 Drawing Sheets

(51) Int. Cl.
  *H01L 21/4757* (2006.01)
  *H01L 21/4763* (2006.01)
(52) U.S. Cl.
  CPC ............ *H01L 21/02178* (2013.01); *H01L 21/02244* (2013.01); *H01L 21/02252* (2013.01); *H01L 21/47573* (2013.01); *H01L 21/47635* (2013.01); *H01L 27/1225* (2013.01)

(56) References Cited

U.S. PATENT DOCUMENTS

| 2007/0188671 | A1 | 8/2007 | Hwang et al. |
| 2014/0070206 | A1* | 3/2014 | Dai ................... H01L 29/24 257/43 |
| 2015/0115273 | A1* | 4/2015 | Yan ................. H01L 29/4908 438/287 |
| 2015/0227013 | A1 | 8/2015 | Hao et al. |
| 2017/0243949 | A1 | 8/2017 | Gao |
| 2021/0167098 | A1 | 6/2021 | Liu et al. |

FOREIGN PATENT DOCUMENTS

| CN | 1909235 A | 2/2007 |
| CN | 101887893 A | 11/2010 |
| CN | 103779360 A | 5/2014 |
| CN | 104766802 A | 7/2015 |
| CN | 110148601 A | 8/2019 |

* cited by examiner

US 11,961,848 B2

DISPLAY SUBSTRATE AND MANUFACTURING METHOD THEREFOR, AND DISPLAY DEVICE

CROSS REFERENCE TO RELATED APPLICATIONS

The present application claims priority to Chinese Patent Application No. 201910468906.9, entitled "DISPLAY SUBSTRATE AND MANUFACTURING METHOD THEREFOR, AND DISPLAY DEVICE", filed with the China National Intellectual Property Administration on May 31, 2019, which is hereby incorporated by reference in its entirety.

FIELD

The present application relates to the field of display technology, in particular to a display substrate and a manufacturing method therefor, and a display device.

BACKGROUND

Currently, a thin film transistor (TFT) is a main driving element of a liquid crystal display and an active matrix organic light emitting diode (AMOLED). During a TFT manufacturing process, a short circuit may occur in an overlap region formed by a gate line and a data line due to process reasons, which causes a panel to generate bright lines, resulting in a decrease in the yield of the panel.

SUMMARY

Embodiments of the present application provide a display substrate and a manufacturing method therefor, and a display device, to solve the problem in the related art of panel yield decrease caused by the short circuit in the overlap region formed by the gate line and the data line.

Therefore, embodiments of the present application provide a display substrate, including:

a substrate base; and an active layer, a gate insulating layer, a first metal film layer, an interlayer insulating layer, a second metal film layer, and a passivation layer stacked successively on the substrate base, wherein the first metal film layer includes a pattern of a gate and of a gate line; the second metal film layer includes a pattern of a source/drain and of a data line; and an oxide metal layer; wherein an opposite region is defined by the gate line opposite to the data line, the oxide metal layer is on a surface of the opposite region facing the data line, and the gate line and the data line are arranged partially opposite to each other.

Optionally, in specific implementation, in the above-mentioned display substrate provided in the embodiments of the present application, the opposite region includes: an overlap region formed by the gate line and the data line, and two symmetrical first regions beyond the overlap region along an extending direction of the gate line.

Optionally, in specific implementation, in the above-mentioned display substrate provided in the embodiments of the present application, the width of each of the first regions in the extending direction of the gate line is 2 μm to 3 μm.

Optionally, in a direction perpendicular to the extending direction of the gate line, the width of the opposite region of the gate line exceeds a width of a region adjacent thereto.

Optionally, the first metal film layer includes a first metal element, and the oxide metal layer is an oxide of the first metal element.

Optionally, in specific implementation, in the above-mentioned display substrate provided in the embodiments of the present application, the first metal film layer includes a first molybdenum metal layer, a copper metal layer, an aluminum metal layer and a second molybdenum metal layer successively stacked on a side of the gate insulating layer away from the substrate base; the opposite region includes the first molybdenum metal layer and the copper metal layer; and the oxide metal layer is an aluminum oxide formed after the aluminum metal layer is oxidized.

Correspondingly, embodiments of the present application further provide a display device including any above-mentioned display substrate provided in the embodiments of the present application.

Correspondingly, embodiments of the present application further provide a manufacturing method for any above-mentioned display substrate, including:

forming an active layer and a gate insulating layer stacked successively on a substrate base;

forming a first metal film layer on the gate insulating layer, and forming a pattern of a gate and of a gate line by patterning the first metal film layer;

forming an oxide metal layer on a surface of an opposite region, opposite to a data line to be formed, of the gate line; and forming an interlayer insulating layer, a second metal film layer and a passivation layer successively on the oxide metal layer, wherein the second metal film layer includes a pattern of the data line and of a source/drain.

Further, in specific implementation, in the above-mentioned manufacturing method for the display substrate provided in the embodiments of the present application, the forming the first metal film layer on the gate insulating layer includes:

depositing a first molybdenum metal layer, a copper metal layer, an aluminum metal layer, and a second molybdenum metal layer successively on the gate insulating layer; and the forming the pattern of the gate and of the gate line by patterning the first metal film layer includes:

forming a photoresist layer on the second molybdenum metal layer;

forming a photoresist pattern by patterning the photoresist layer, wherein the photoresist pattern includes a partially retained region, a completely retained region, and a completely removed region, the partially retained region covers the opposite region, the completely retained region covers a region where the gate and the gate line are located, and the completely removed region covers other regions; and forming the pattern of the gate and of the gate line by wet etching the exposed first molybdenum metal layer, copper metal layer, aluminum metal layer, and second molybdenum metal layer by using the photoresist pattern as a shield.

Optionally, in specific implementation, in the above-mentioned manufacturing method for the display substrate provided in the embodiments of the present application, the forming the oxide metal layer on the surface of the opposite region, opposite to the data line to be formed, of the gate line includes:

removing the photoresist layer in the partially retained region by using an ashing process;

dry etching the gate insulating layer, and at the same time etching away the second molybdenum metal layer in the partially retained region; and forming an aluminum oxide layer by oxidizing the aluminum metal layer in the opposite region using plasma containing $O_2$.

Optionally, in specific implementation, in the above-mentioned manufacturing method for the display substrate provided in the embodiments of the present application, before the oxidizing the aluminum metal layer in the opposite region using plasma containing $O_2$, the method further includes: performing conductor treatment on the active layer exposed after the gate insulating layer is dry etched.

Optionally, in specific implementation, in the above-mentioned manufacturing method for the display substrate provided in the embodiments of the present application, the patterning the photoresist layer includes: patterning the photoresist layer by using a half-tone mask, wherein the half-tone mask includes: a completely light-transmitting region corresponding to the completely removed region, a partially light-transmitting region corresponding to the partially retained region, and a non-light-transmitting region corresponding to the completely retained region; and a light transmission amount of the partially light-transmitting region is 75%-85% of that of the completely light-transmitting region.

Further, in specific implementation, in the above-mentioned manufacturing method for the display substrate provided in the embodiments of the present application, the thickness of the photoresist layer is 2.0 µm to 2.2 µm, and the thickness of the photoresist pattern in the partially retained region is 0.3 µm to 0.5 µm.

Optionally, in specific implementation, in the above-mentioned manufacturing method for the display substrate provided in the embodiments of the present application, dry etching the gate insulating layer includes: dry etching the gate insulating layer by using a combined gas of $O_2$ and $CF_4$, wherein the flow of $O_{is}$ 1000 sccm to 1500 sccm, and the flow of $CF_4$ is 2000 sccm to 2500 sccm.

DETAILED DESCRIPTION OF THE EMBODIMENTS

Figure 1:
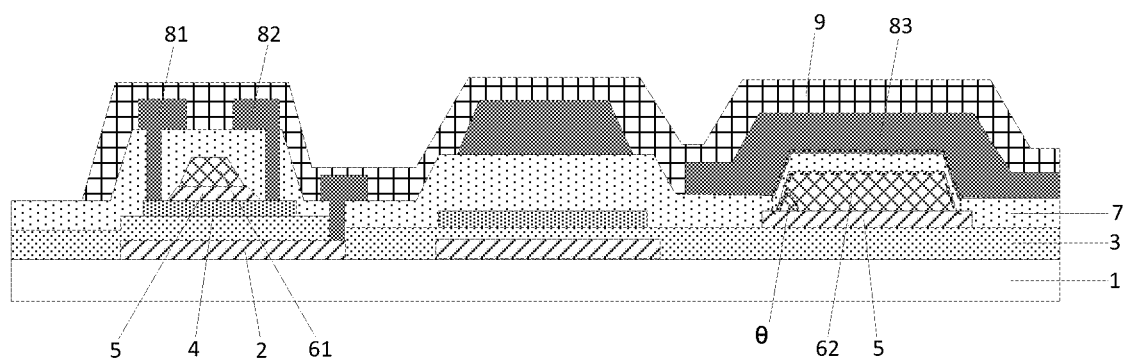
FIG. 1 is a structural diagram of a display substrate provided in the related art.

To make the objects, technical solutions, and advantages of the present application clearer, specific implementations of a display substrate and a manufacturing method therefor, and a display device provided in embodiments of the present application are described in detail in conjunction with the accompanying drawings.

The thickness and shape of each film layer in the drawings do not reflect the true scale of the display substrate, and are merely intended to illustrate the present application.

A TFT of a top-gate structure has attracted attention due to a higher on-state current, a higher aperture ratio and higher TFT stability than a TFT of a bottom-gate structure.

As shown in FIG. 1, a display substrate with a TFT of a top-gate structure in the related art includes a substrate base 1, and a light-shielding metal layer 2, a buffer layer 3, an active layer 4, a gate insulating layer 5, a gate metal layer 6, and an interlayer insulating layer 7 successively provided on the substrate base 1, a source/drain metal layer 8 formed on the interlayer insulating layer 7, and a passivation layer 9 covering the source/drain metal layer 8. The gate metal layer 6 includes a gate 61 and a gate line 62, and the source/drain metal layer 8 includes a source 81, a drain 82 and a data line 83. The source 81 and the drain 82 are respectively electrically connected to the active layer 4 through via holes running through the interlayer insulating layer 7.

During preparation of the display substrate with the TFT of the top-gate structure, both the gate metal layer 6 and the source/drain metal layer 8 use copper, and the thickness of copper used in the gate metal layer 6 can be 400 nm or more, and the thickness of copper used in the source/drain metal layer 8 can be 500 nm or more. Due to the large thickness of the deposited copper, copper angle (an included angle θ between a side surface and a bottom surface of the gate line 62) is difficult to improve after wet etching, and the included angle θ is usually greater than 60 degrees, such that when the interlayer insulating layer 7 is deposited on the gate metal layer 6 subsequently by a deposition process, as edges of the gate line 62 are steep due to the included angle θ, the deposited interlayer insulating layer 7 becomes thinner at the edges of the gate line 62, and cannot completely prevent a short circuit between the gate line 62 and the data line 83. In addition, the copper has thermal diffusibility for the interlayer insulating layer 7 (SiO material) in a high-temperature deposition or etching process, so in an overlap region formed by the gate line 62 and the data line 83 (denoted by a dashed frame in FIG. 1), a short circuit is liable to occur between the gate line 62 and the data line 83, which causes the display panel to generate bright lines, resulting in a decrease in the yield of the display panel.

Figure 2:
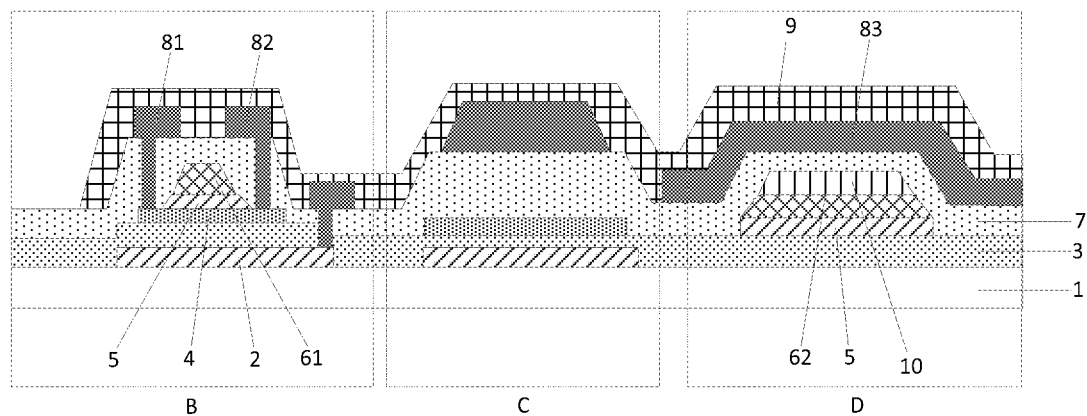
FIG. 2 is a structural diagram of a display substrate provided in an embodiment of the present application.
Figure 3:
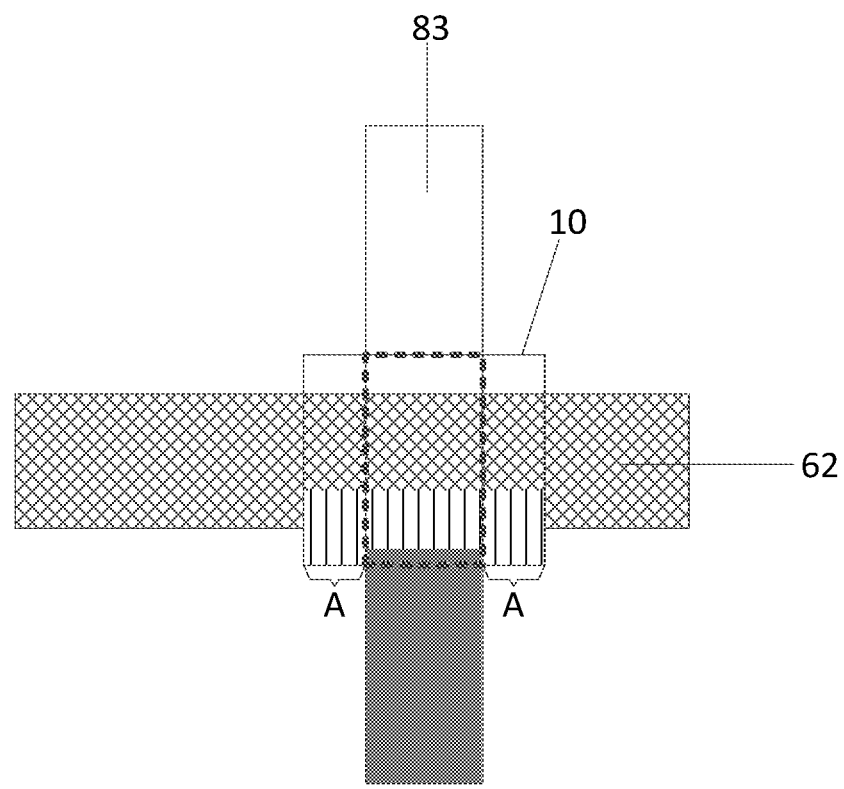
FIG. 3 is a top-view structural diagram of a part of film layers of the display substrate shown in FIG. 2.

In view of this, to solve the above problem, embodiments of the present application provide a display substrate, as shown in FIGS. 2 and 3. FIG. 2 is a sectional structure diagram of the display substrate, and FIG. 3 is a top-view structure diagram of some film layers in FIG. 2. The display substrate includes: a substrate base 1, and an active layer 4, a gate insulating layer 5, a gate 61, an interlayer insulating layer 7, a source/drain (a source 81 and a drain 82), and a passivation layer 9 stacked successively on the substrate base 1, wherein a first metal film layer where the gate 61 is located further includes a gate line 62, and a second metal film layer where the source/drain (the source 81 and the drain 82) is located further includes a data line 83; the gate line 62 and the data line 83 are arranged partially opposite to each other; and an oxide metal layer 10 is provided on a surface, facing the data line 83, of an opposite region, opposite to the data line 83, of the gate line 62.

In the display substrate provided in the embodiments of the present application, an oxide metal layer is provided on the surface of the gate line that has a region opposite to the data line. Due to a high dielectric constant and breakdown voltage of the oxide metal layer, the possibility of a short circuit in the overlap region formed by the gate line and the data line can be greatly reduced. Therefore, the use of the display substrate provided in the embodiments of the present application can solve the problem in the related art of panel yield decrease caused by the short circuit in the overlap region formed by the gate line and the data line.

Specifically, as shown in FIGS. 2 and 3, the display substrate may further include a light-shielding metal layer 2 and a buffer layer 3 both located between the substrate base 1 and the active layer 4.

Further, in specific implementation, in the above-mentioned display substrate provided in the embodiments of the present application, as shown in FIG. 3, the opposite region includes: the overlap region (denoted by a black dotted frame in FIG. 3) formed by the gate line 62 and the data line 83, and two symmetrical first regions A beyond the overlap region along an extending direction of the gate line 62. That is, the oxide metal layer 10 covers the overlap region formed by the gate line 62 and the data line 83 (denoted by the black dotted frame in FIG. 3), and covers the two symmetrical first regions A beyond the overlap region along the extending direction of the gate line 62.

Optionally, as shown in FIG. 3, the width of each first region A along the extending direction of the gate line 62 is 2 μm to 3 μm.

Further, in specific implementation, as shown in FIG. 3, to ensure that the oxide metal layer 10 completely covers the overlap region formed by the gate line 62 and the data line 83, in the above-mentioned display substrate provided in the embodiments of the present application, in a direction perpendicular to the extending direction of the gate line 62, the width of the opposite region of the gate line 62 exceeds a width of a region adjacent thereto.

Specifically, the size of the oxide metal layer 10 is set to be larger than the overlap region formed by the gate line 62 and the data line 83, which can avoid that the coverage of aluminum oxide deviates from the overlap region due to the production process.

Further, in specific implementation, in the display substrate provided in the embodiments of the present application, the first metal film layer includes a first metal element, and the oxide metal layer is an oxide of the first metal element. That is, the oxide metal layer may be a metal oxide layer formed by oxidization of the first metal element in the first metal film layer.

Further, in specific implementation, in the above-mentioned display substrate provided in the embodiments of the present application, as shown in FIG. 2, the first metal film layer includes a first molybdenum metal layer, a copper metal layer, an aluminum metal layer and a second molybdenum metal layer successively stacked on a side of the gate insulating layer 57 away from the substrate base 1, that is, the gate 61 in the embodiments of the present application is composed of the stacked first molybdenum metal layer, copper metal layer, aluminum metal layer and second molybdenum metal layer; the opposite region includes the first molybdenum metal layer and the copper metal layer; and the oxide metal layer 10 is an aluminum oxide formed after the aluminum metal layer is oxidized, that is, the first metal element in the first metal film layer is element aluminum. Due to a high dielectric constant and breakdown voltage of oxide aluminum, the possibility of a short circuit in the overlap region formed by the gate line and the data line can be greatly reduced.

Specifically, in the embodiments of the present application, the aluminum metal layer at the opposite region may be oxidized only on the surface, and may also be all oxidized, and the opposite region of the gate may be composed of the first molybdenum metal layer, the copper metal layer and part of the aluminum metal layer which are arranged in a stacked manner, and may also be only composed of the first molybdenum metal layer and the copper metal layer.

Further, in specific implementation, in the above-mentioned display substrate provided in the embodiments of the present application, as shown in FIG. 2, the display substrate has a TFT region B, a capacitor region C, and an overlap region D formed by the gate line 62 and the data line 83.

It should be noted that the display substrate provided in the embodiments of the present application can be applied to a liquid crystal display (LCD) panel and an organic electroluminescent diode (organic light emitting diode, OLED) display panel.

When the display substrate is applied to a liquid crystal display panel, the display substrate may further include a pixel electrode electrically connected to the drain of a TFT; further, it may further include a common electrode.

When the display substrate is applied to an OLED display panel, the display substrate may further include an anode electrically connected to the drain of the TFT, a cathode, and an organic functional layer located between the anode and the cathode.

Figure 4:
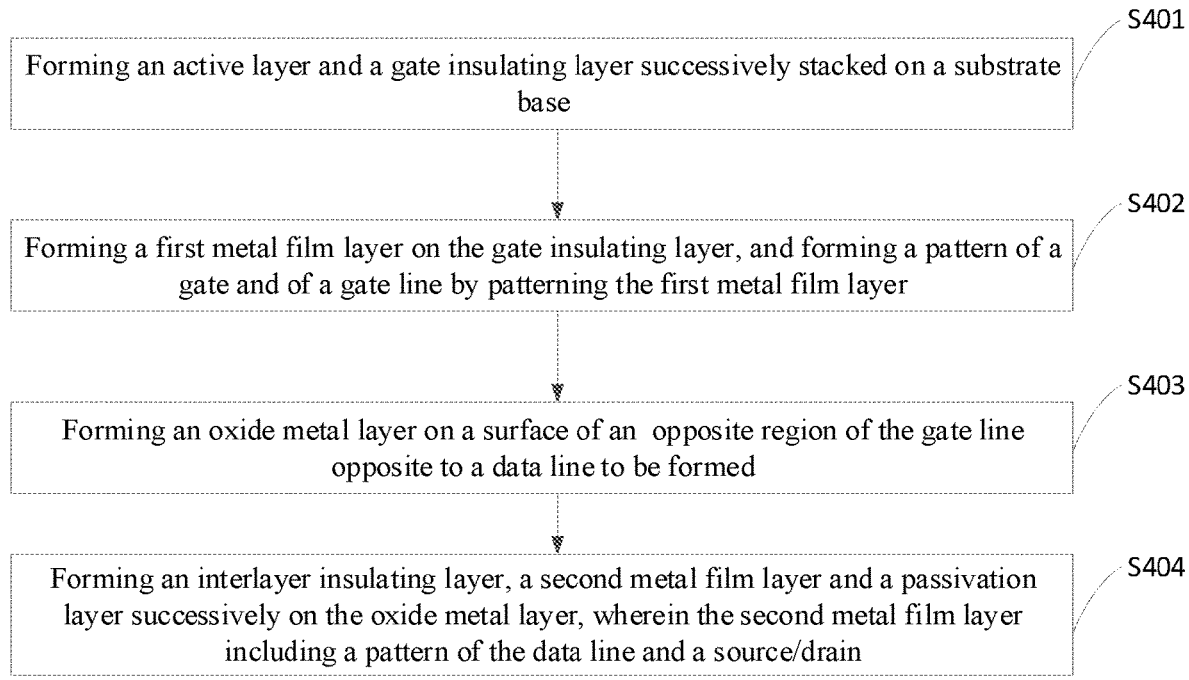
FIG. 4 is a first flow diagram of a manufacturing method for the display substrate provided in embodiments of the present application.

Based on the same inventive concept, embodiments of the present application further provide a manufacturing method for a display substrate, as shown in FIG. 4, including the following steps.

S401, forming an active layer and a gate insulating layer successively stacked on a substrate base.

S402, forming a first metal film layer on the gate insulating layer, and forming a pattern of a gate and of a gate line by patterning the first metal film layer.

S403, forming an oxide metal layer on a surface of an opposite region of the gate line opposite to a data line to be formed.

S404, forming an interlayer insulating layer, a second metal film layer and a passivation layer successively on the oxide metal layer, wherein the second metal film layer including a pattern of the data line and of a source/drain.

In the manufacturing method for the display substrate provided in the embodiments of the present application, an oxide metal layer is formed on the surface of the gate line that has an opposite region opposite to the data line. Due to a high dielectric constant and breakdown voltage of the oxide metal layer, the possibility of a short circuit in the overlap region formed by the gate line and the data line can be greatly reduced. Therefore, the use of the manufacturing method for the display substrate provided in the embodiments of the present application can solve the problem in the related art of panel yield decrease caused by the short circuit in the overlap region formed by the gate line and the data line.

Further, in specific implementation, in the above-mentioned manufacturing method for the display substrate provided in the embodiments of the present application, the forming the first metal film layer on the gate insulating layer may specifically include: depositing a first molybdenum metal layer, a copper metal layer, an aluminum metal layer, and a second molybdenum metal layer successively on the gate insulating layer.

Figure 5:
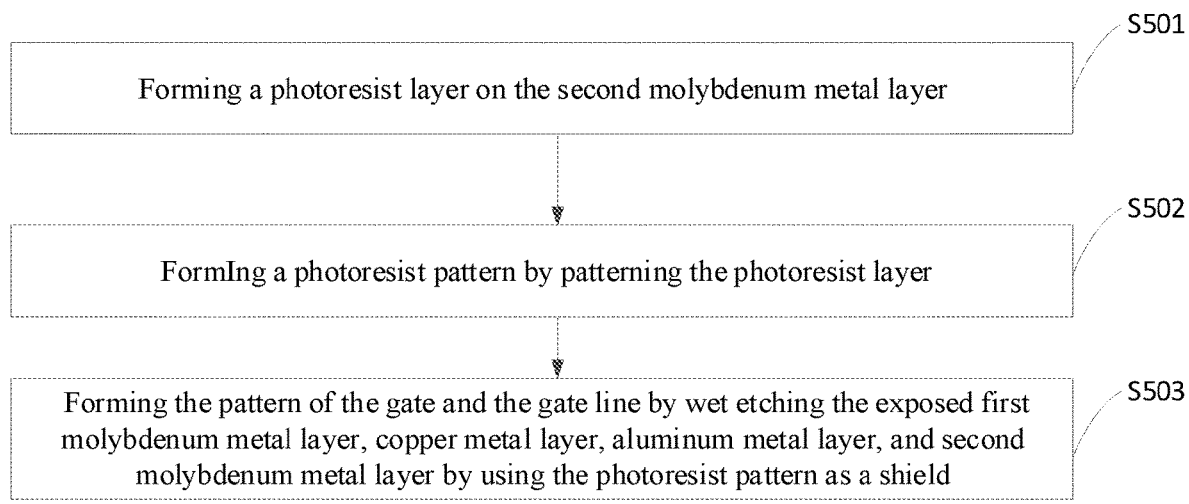
FIG. 5 is a second flow diagram of the manufacturing method for the display substrate provided in the embodiments of the present application.

As shown in FIG. 5, the forming the pattern of the gate and of the gate line by patterning the first metal film layer may specifically include the following steps.

S501, forming a photoresist layer on the second molybdenum metal layer.

S502, forming a photoresist pattern by patterning the photoresist layer, wherein the photoresist pattern includes a partially retained region, a completely retained region, and a completely removed region, the partially retained region covers the opposite region, the photoresist completely retained region covers a region where the gate and the gate line are located, and the completely removed region covers other regions.

S503, forming the pattern of the gate and of the gate line by wet etching the exposed first molybdenum metal layer, copper metal layer, aluminum metal layer, and second molybdenum metal layer by using the photoresist pattern as a shield.

Figure 6:
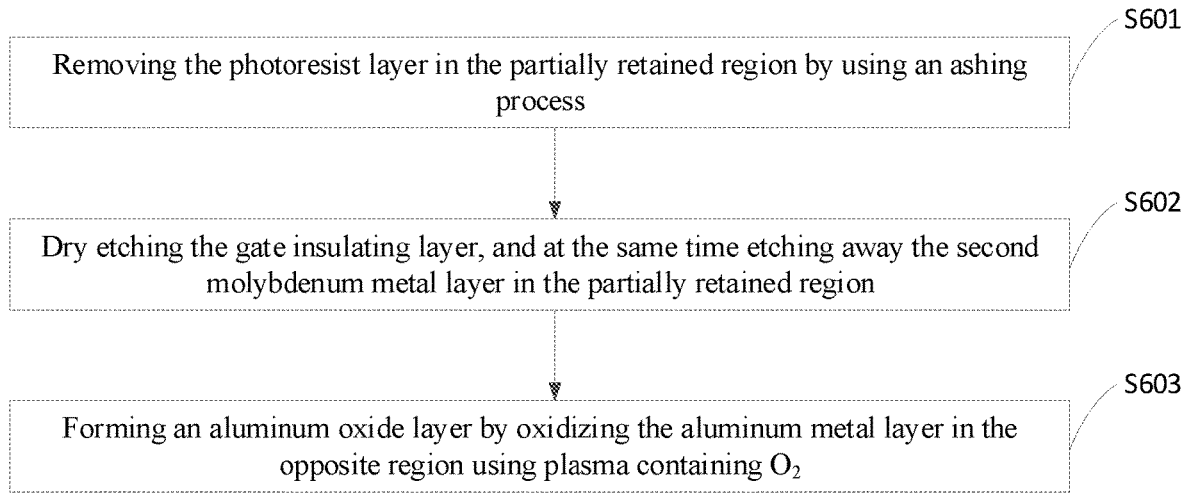
FIG. 6 is a third flow diagram of the manufacturing method of the display substrate provided in the embodiments of the present application.

Further, in specific implementation, in the above-mentioned manufacturing method for the display substrate provided in the embodiments of the present application, as shown in FIG. 6, the forming the oxide metal layer on the surface of the opposite region of the gate line opposite to the data line to be formed may specifically include the following steps.

S601, removing the photoresist layer in the partially retained region by using an ashing process.

S602, dry etching the gate insulating layer, and at the same time etching away the second molybdenum metal layer in the partially retained region.

S603, forming an aluminum oxide layer by oxidizing the aluminum metal layer in the opposite region using plasma containing $O_2$.

Figure 7:
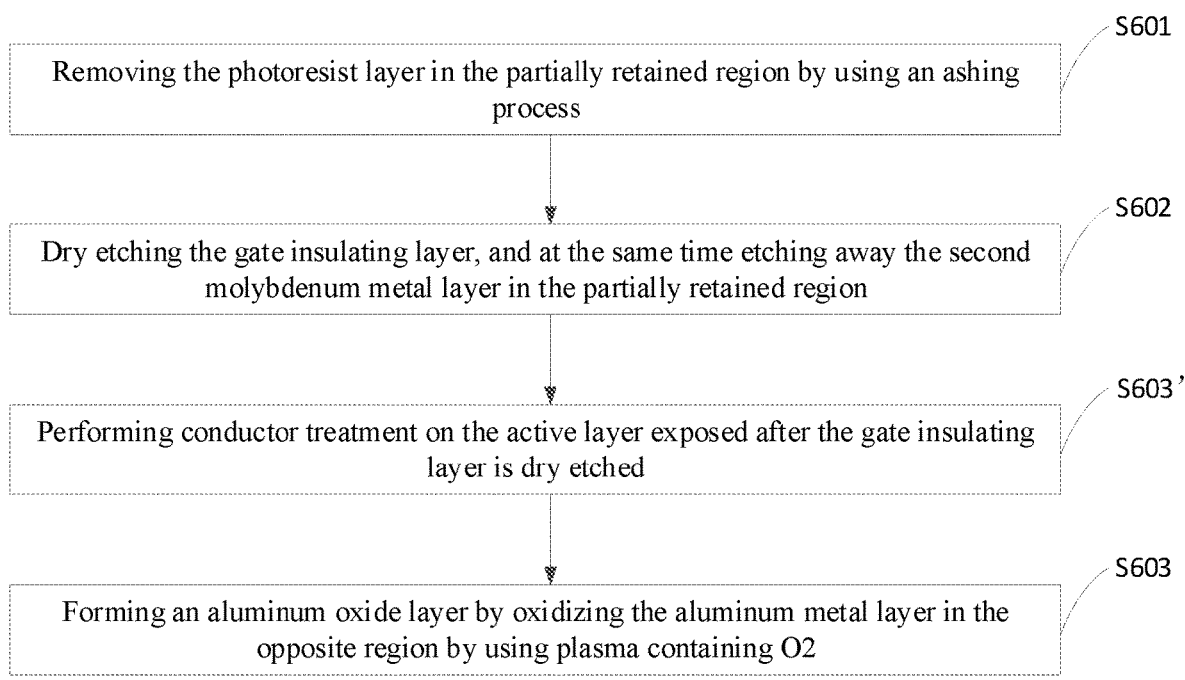
FIG. 7 is a fourth flow diagram of a manufacturing method for the display substrate provided in the embodiments of the present application.

Further, in specific implementation, in the manufacturing method for the display substrate provided in the embodiments of the present application, as shown in FIG. 7, before oxidizing the aluminum metal layer in the opposite region using plasma containing $O_2$, the method further includes: S603', performing conductor treatment on the active layer exposed after the gate insulating layer is dry etched.

Further, in specific implementation, in the manufacturing method for the display substrate provided in the embodiments of the present application, the patterning the photoresist layer specifically includes: patterning the photoresist layer by using a half-tone mask, wherein the half-tone mask includes: a completely light-transmitting region corresponding to the completely removed region, a partially light-transmitting region corresponding to the partially retained region, and a non-light-transmitting region corresponding to the completely retained region; and a light transmission amount of the partially light-transmitting region is 75%-85% of that of the completely light-transmitting region.

Further, in specific implementation, in the manufacturing method for the display substrate provided in the embodiments of the present application, the thickness of the photoresist layer may be 2.0 μm to 2.2 μm, and the thickness of the photoresist pattern in the partially retained region may be 0.3 μm to 0.5 μm.

Further, in specific implementation, in the manufacturing method for a display substrate provided in the embodiments of the present application, the dry etching the gate insulating layer may specifically include: dry etching the gate insulating layer by using a combined gas of $O_2$ and $CF_4$, wherein the flow of $O_2$ is 1000 sccm to 1500 sccm, and the flow of $CF_4$ is 2000 sccm to 2500 sccm.

The manufacturing method for the display substrate provided in the embodiments of the present application will be described in detail below through a specific embodiment.

Figure 8A:
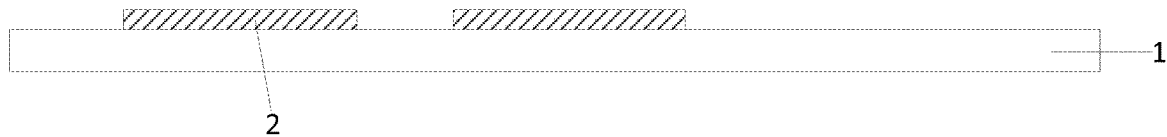
FIGS. 8A to 8N are sectional diagrams after execution of respective steps in a manufacturing method for the display substrate provided in the embodiments of the present application.

(1) A layer of light-shielding metal film may be deposited on a substrate base 1 by chemical vapor deposition. The light-shielding metal film may be made of a metal such as molybdenum or molybdenum-niobium alloy, with a thickness of 0.10 μm to 0.15 μm. Next, exposure, development and wet etching are performed to form a light-shielding metal layer 2, as shown in FIG. 8A; specifically, wet etching of the light-shielding metal film may be etching with mixed acids.

Figure 8B:
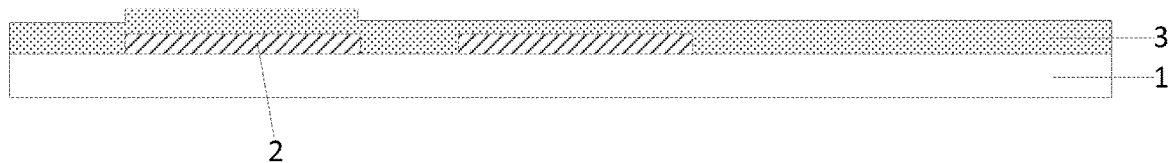

(2) A buffer layer 3 may be deposited on the substrate base 1 by a chemical vapor deposition or magnetron sputtering method, as shown in FIG. 8B; specifically, the buffer layer 3 may be made of silicon oxide, with a thickness of 0.3 μm to 0.5 μm.

Figure 8C:
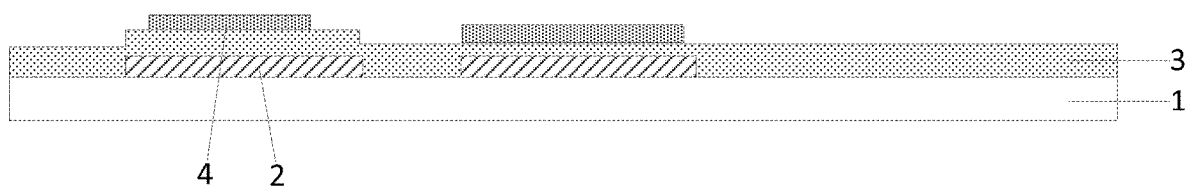

(3) A metal oxide semiconductor film may be deposited on the buffer layer 3 by chemical vapor deposition, and then a patterning process is performed on the metal oxide semiconductor film to form an active layer 4, as shown in FIG. 8C, that is, after a photoresist is applied, the photoresist is exposed, developed, and etched with a common mask to form the active layer 4. Specifically, the active layer 4 can be made of indium tin oxide (IGZO), with a thickness of 0.05 μm to 0.1 μm.

Figure 8D:

(4) A layer of gate insulating film 01 may be deposited on the substrate base 1 by a chemical vapor deposition or magnetron sputtering method, as shown in FIG. 8D; specifically, the gate insulating film 01 may be made of silicon oxide, with a thickness of 0.1 μm to 0.2 μm.

Figure 8E:
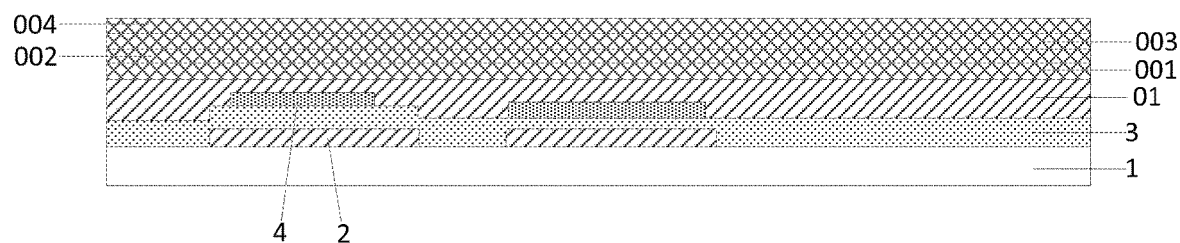

(5) A first metal film layer may be deposited on the substrate base 1 by a magnetron sputtering method. Specifically, a first metal film layer composed of a first molybdenum metal layer 001, a copper metal layer 002, an aluminum metal layer 003 and a second molybdenum metal layer 004 may be successively deposited on the gate insulating film 01, as shown in FIG. 8E; specifically, the thickness of the first molybdenum metal layer 001 may be 0.03 μm to 0.04 μm, the thickness of the copper metal layer 002 may be 0.4 μm to 0.5 μm, the thickness of the aluminum metal layer 003 may be 0.06 μm to 0.08 μm, and the thickness of the second molybdenum metal layer 004 may be 0.05 μm.

Figure 8F:
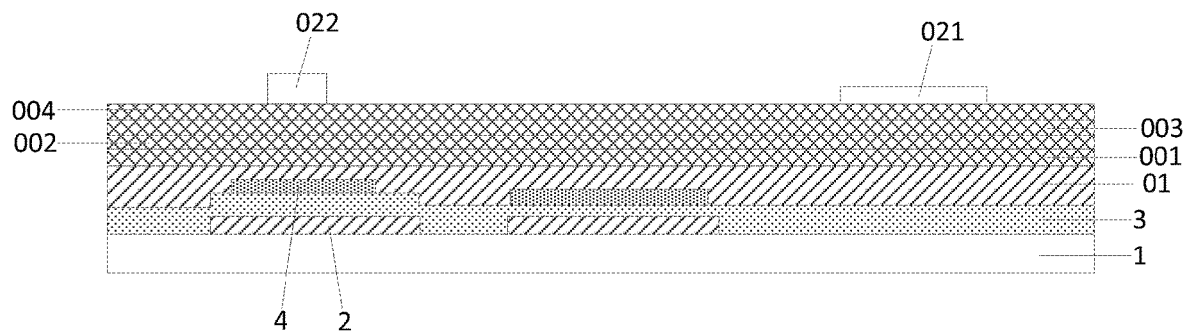

(6) A photoresist layer is formed on the second molybdenum metal layer 004, and then the photoresist layer is exposed, developed and etched by using a half-tone mask to form a photoresist pattern, as shown in FIG. 8F; specifically, the photoresist pattern includes a partially retained region 021, a completely retained region 022, and a completely removed region, wherein the partially retained region 021 covers an opposite region (an opposite region of a gate line 62 to be formed), the completely retained region 022 covers a region where a gate 61 and the gate line 62 are located except the opposite region, and the completely removed region covers other regions. Specifically, the photoresist layer is a positive photoresist, the thickness of which may be 2.0 μm to 2.2 μm, and the thickness of the photoresist in the partially retained region 021 may be 0.3 μm to 0.5 μm.

Figure 8G:
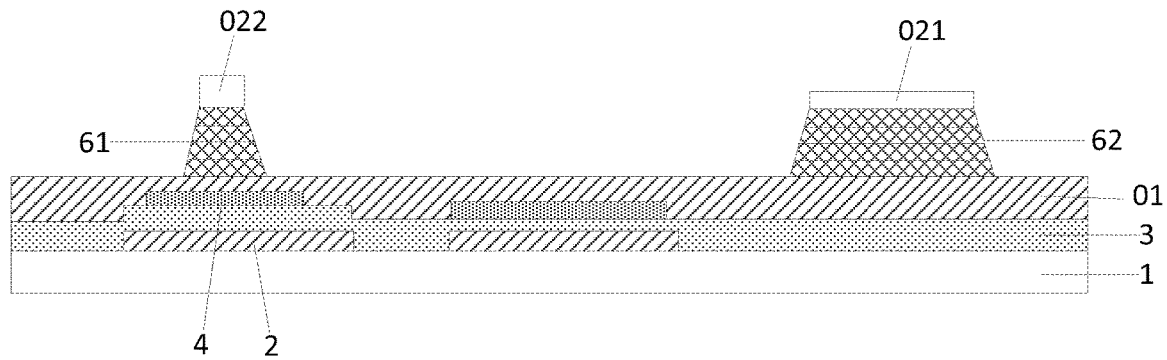

(7) The exposed first molybdenum metal layer 001, copper metal layer 002, aluminum metal layer 003, and second molybdenum metal layer 004 are wet etched by using the photoresist pattern (021 and 022) as a shield to form a pattern of the gate 61 and the gate line 62, as shown in FIG. 8G; specifically, wet etching of the above four metal layers may be etching with mixed acids, such as nitric acid, acetic acid and phosphoric acid mixed in a certain ratio.

Figure 8H:
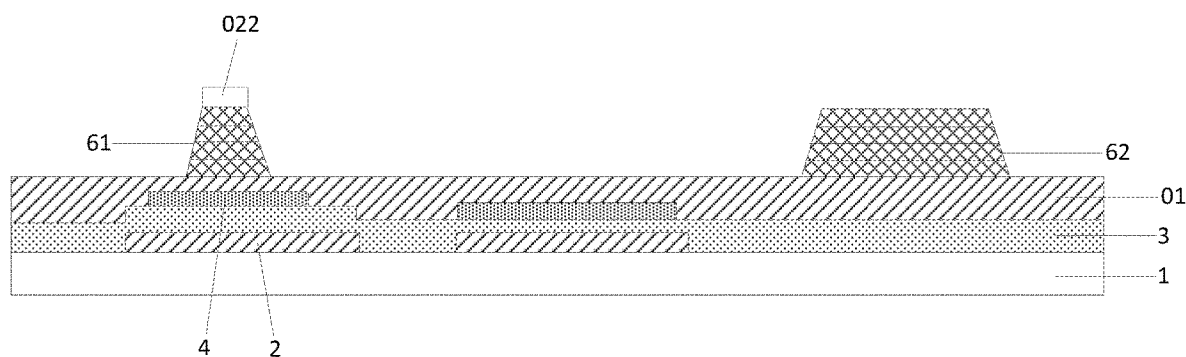

(8) The photoresist layer in the partially retained region 021 is removed by using an ashing process, as shown in FIG. 8H; specifically, 0.3 μm to 0.5 μm photoresist in the partially retained region 021 is ashed away by using $O_2$ with a flow of 10000 sccm to 12000 sccm, controlling corresponding time, and using a high source power and a high bias power.

Figure 8I:
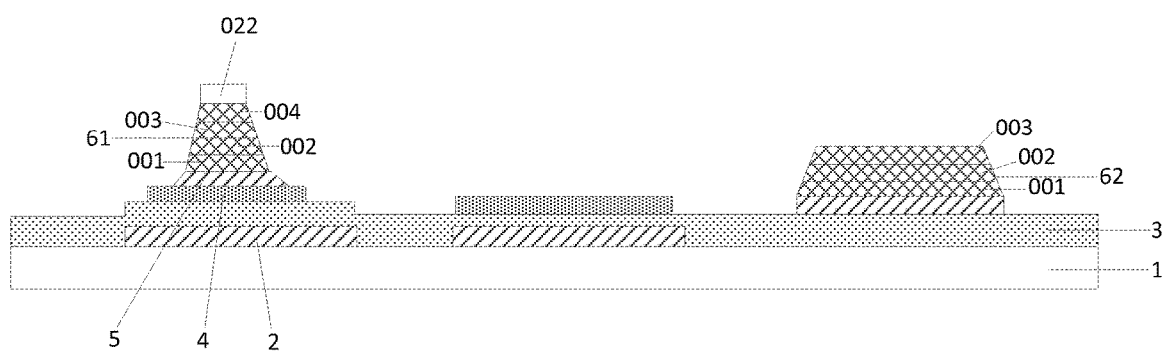

(9) The gate insulating film 01 is dry etched with a gate mask (i.e., the photoresist pattern 022) above the gate 61 being retained, to form a gate insulating layer 5. While the gate insulating film 02 is dry etched, the second metal molybdenum layer 004 in the opposite region is etched away, to expose the aluminum metal layer 003 in the opposite region, as shown in FIG. 8I; specifically, the gate insulating film 01 without photoresist protection is dry etched by using a mixed gas of $CF_4$ with a flow of 2000 sccm to 2500 sccm and $O_2$ with a flow of 1000 sccm to 1500 sccm. Particularly, while the gate insulating film 01 is dry etched, the uppermost second metal molybdenum layer 004 of the gate line 62 can be etched away.

(10) The gate insulating layer 5 is dry etched with the gate mask (i.e., the photoresist pattern 022) above the gate 61 being still retained, to expose the active layer 4, which is then subjected to conductor treatment. The active layer 4 includes a channel region covered by the gate insulating layer 5, and a source contact region and a drain contact region located on two sides of the channel region respectively, and thus the conductor treatment on the source contact region and the drain contact region can reduce contact resistance of a source 81 and a drain 82 to be formed and the active layer 4 (as shown in FIG. 8M) and improve the conductivity. Specifically, ammonia gas ($NH_3$) or helium (He) gas may be used for the conduction treatment.

Figure 8J:
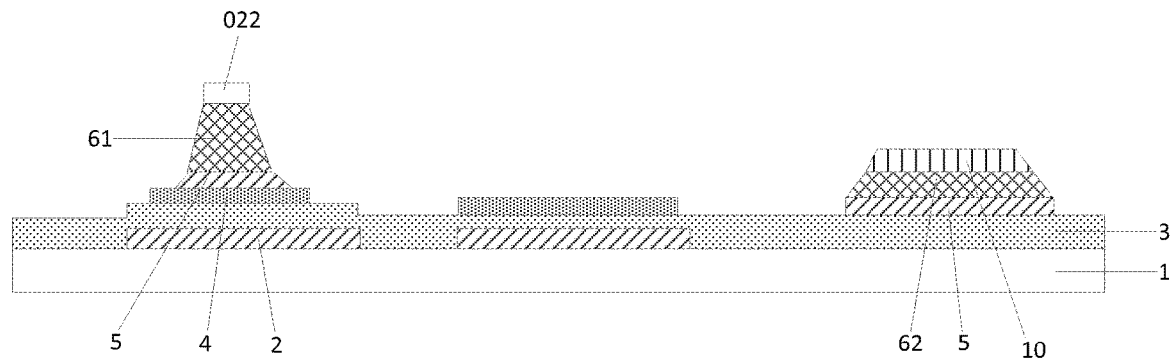

(11) The surface of the aluminum metal layer 003 in the opposite region is oxidized by using plasma containing $O_2$ to form an oxide metal layer 10, that is, an aluminum oxide layer, on the surface of the aluminum metal layer 003, as shown in FIG. 8J; specifically, $O_2$ with a flow of 10000 sccm to 12000 sccm can be used, and as surface hardening photoresistance is generated on the surface of the photoresist in the completely retained region 022 during dry etching of the gate insulating film 01, the oxidation process not only can oxidize the surface of the aluminum metal layer 003 in the opposite region to transform it into aluminum oxide, but also can remove the hardening photoresistance generated on the surface of the photoresist.

Figure 8K:
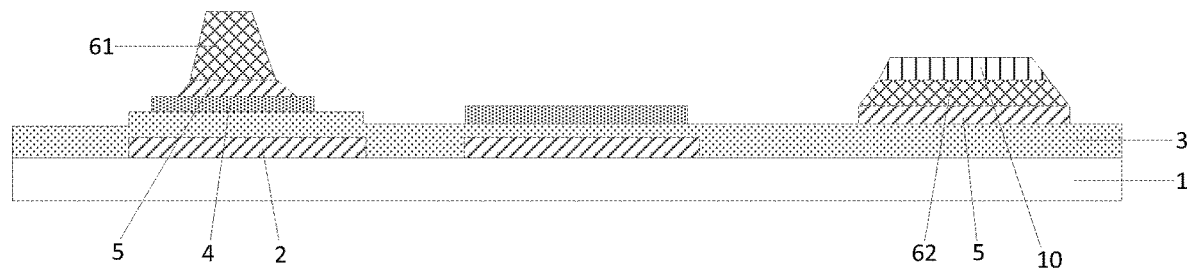

(12) The photoresist in the completely retained region 022 is wet stripped, as shown in FIG. 8K.

Figure 8L:
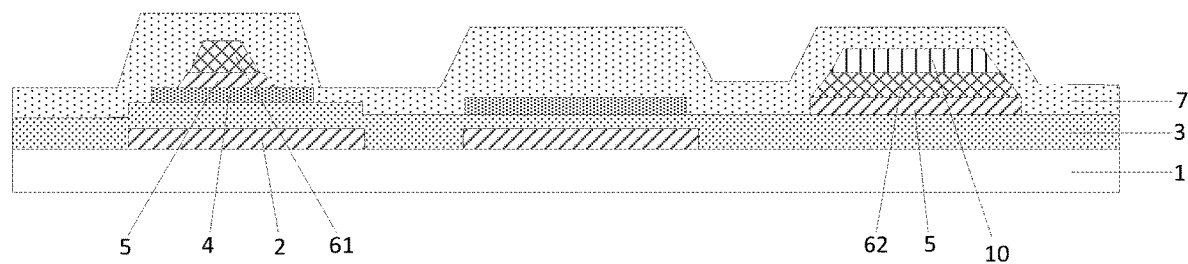
Figure 8M:
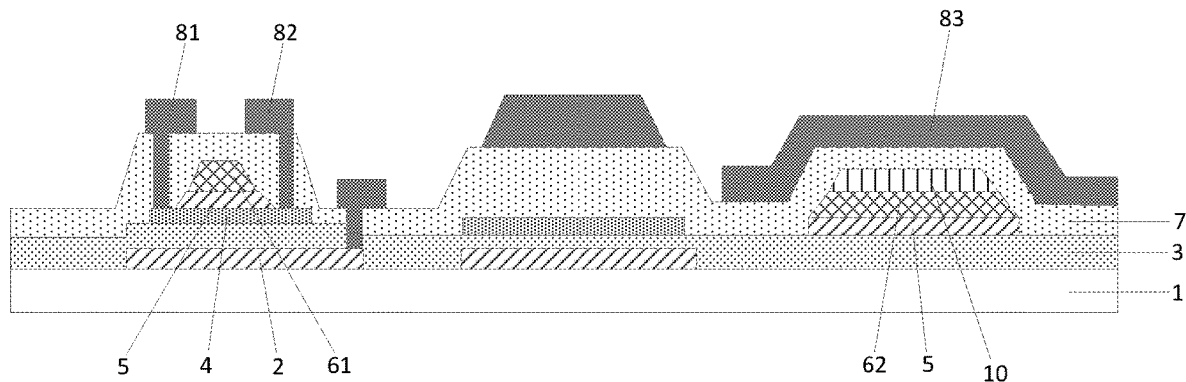

(13) An interlayer insulating layer 7 is formed on the oxide metal layer 10, as shown in FIG. 8L. Specifically, the interlayer insulating layer 7 may be made of silicon oxide, with a thickness of 0.45 μm to 0.6 μm.

(14) A second metal film layer is deposited on the interlayer insulating layer 7 by using a method similar to the preparation of the gate 61 and the gate line 62, and the source 81, the drain 82 and a data line 83 are formed by a patterning process, as shown in FIG. 8M. Specifically, in the case of depositing a layer of metal copper, its thickness may be 0.5 μm to 0.6 μm, and subsequently photolithography is performed with a mask. The thickness of a source/drain mask photoresist may be 1.5 μm to 1.8 μm, and the photoresist used is a positive photoresist. This mask is used to perform wet etching to form the data line first. Wet etching of copper may be performed with a hydrogen peroxide ($H_2O_2$) solution. After the wet etching is completed, the photoresist is stripped. After the photoresist stripping is completed, the line width of the data line 83 should be 10 μm or less.

Figure 8N:
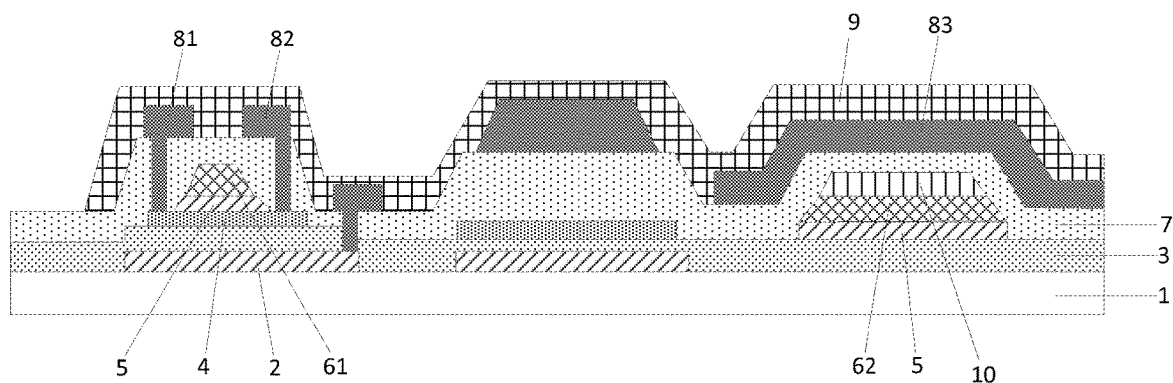

(15) Finally, a passivation layer 9 is deposited, as shown in FIG. 8N. Specifically, the passivation layer 9 may be made of silicon oxide, with a thickness of 0.3 μm to 0.5 μm.

After the above steps (1) to (15), an aluminum oxide layer can be formed in the opposite region, that is, a crossing region, between the gate line 62 and the data line 83. Due to a higher dielectric constant and breakdown voltage of oxide aluminum, the possibility of a short circuit between the gate line 62 and the data line 83 can be greatly reduced. In addition, it should be noted that although the above steps only describe the pattern formation process of the regions of the TFT, the gate line and the data line in detail, the preparation process of the display substrate provided in the embodiments of the present application may also include steps of forming other patterns, such as a step of forming a pattern of the capacitor region C in the display substrate (referring to FIG. 2), and reference may be made to the description of the structure of the display substrate for details, which will not be repeated here.

Based on the same inventive concept, embodiments of the present application further provide a display device including the above-mentioned display substrate provided in the embodiments of the present application. The display device may be a mobile phone, a tablet computer, a television, a display, a notebook computer, a digital photo frame, a navigator, or any other product or component with a display function. For the implementation of the display device, reference may be made to the embodiments of the display substrate described above, and repeated description is omitted.

Embodiments of the present application provide a display substrate and a manufacturing method therefor, and a display device. The display substrate includes: a substrate base, and a light-shielding metal layer, a buffer layer, an active layer, a gate insulating layer, a gate, an interlayer insulating layer, a source/drain, and a passivation layer stacked successively on the substrate base, wherein a first metal film layer where the gate is located further includes a gate line, and a second metal film layer where the source/drain is located further includes a data line; and an oxide metal layer is provided on a surface of an opposite region of the gate line opposite to the data line. In the present application, an oxide metal layer is provided on the surface of the gate line that has an opposite region opposite to the data line. Due to a high dielectric constant and breakdown voltage of the oxide metal layer, the possibility of a short circuit in the overlap region formed by the gate line and the data line can be greatly reduced. Therefore, the use of the display substrate provided in the embodiments of the present application can solve the problem in the related art of panel yield decrease caused by the short circuit in the overlap region formed by the gate line and the data line.

It will be apparent to those skilled in the art that various modifications and variations can be made in the present application without departing from the spirit or scope of the present application. Thus, it is intended that the present application covers the modifications and variations if these modifications and variations of the present application come within the claims of the present application and the scope of their equivalents.

What is claimed is:

1. A display substrate, comprising:
   a substrate base; and
   an active layer, a gate insulating layer, a first metal film layer, an interlayer insulating layer, a second metal film layer, and a passivation layer stacked successively on the substrate base, wherein the first metal film layer comprises a pattern of a gate and of a gate line; the second metal film layer comprises a pattern of a source/drain and of a data line; and
   an oxide metal layer;
   wherein an opposite region is defined by the gate line opposite to the data line, the oxide metal layer is on a surface of the opposite region facing the data line, and the gate line and the data line are arranged partially opposite to each other;

wherein the opposite region comprises: an overlap region formed by the gate line and the data line, and two symmetrical first regions beyond the overlap region along an extending direction of the gate line;

wherein the width of each of the first regions in the extending direction of the gate line is 2 µm to 3 µm;

wherein the first metal film layer comprises a first molybdenum metal layer, a copper metal layer, an aluminum metal layer and a second molybdenum metal layer successively stacked on a side of the gate insulating layer away from the substrate base; the opposite region comprises the first molybdenum metal layer, the copper metal layer and part of the aluminum metal layer; and the oxide metal layer is an aluminum oxide formed after the aluminum metal layer is oxidized;

wherein a thickness of the first molybdenum metal layer ranges from 0.03 µm to 0.04 µm, a thickness of the copper metal layer ranges from 0.4 µm to 0.5 µm, a thickness of the aluminum metal layer ranges from 0.06 µm to 0.08 µm, and a thickness of the second molybdenum metal layer is 0.05 µm.

2. The display substrate according to claim 1, wherein in a direction perpendicular to the extending direction of the gate line, the width of the opposite region of the gate line exceeds a width of a region adjacent thereto.

3. A display device, comprising the display substrate of claim 1.

4. A manufacturing method for a display substrate, wherein the display substrate is according to claim 1, and the manufacturing method comprises:

forming an active layer and a gate insulating layer successively stacked on a substrate base;

forming a first metal film layer on the gate insulating layer, and forming a pattern of a gate and of a gate line by patterning the first metal film layer;

forming an oxide metal layer on a surface of an opposite region, opposite to a data line to be formed, of the gate line; and forming an interlayer insulating layer, a second metal film layer and a passivation layer successively on the oxide metal layer, wherein the second metal film layer comprises a pattern of the data line and of a source/drain.

5. The manufacturing method for the display substrate according to claim 4, wherein the forming the first metal film layer on the gate insulating layer comprises:

depositing a first molybdenum metal layer, a copper metal layer, an aluminum metal layer, and a second molybdenum metal layer successively on the gate insulating layer; and the forming the pattern of the gate and of the gate line by patterning the first metal film layer comprises:

forming a photoresist layer on the second molybdenum metal layer;

forming a photoresist pattern by patterning the photoresist layer, wherein the photoresist pattern comprises a partially retained region, a completely retained region, and a completely removed region, the partially retained region covers the opposite region, the completely retained region covers a region where the gate and the gate line are located, and the completely removed region covers other regions; and forming the pattern of the gate and of the gate line by wet etching the exposed first molybdenum metal layer, copper metal layer, aluminum metal layer, and second molybdenum metal layer by using the photoresist pattern as a shield.

6. The manufacturing method for the display substrate according to claim 5, wherein the forming the oxide metal layer on the surface of the opposite region, opposite to the data line to be formed, of the gate line comprises:

removing the photoresist layer in the partially retained region by using an ashing process;

dry etching the gate insulating layer, and at the same time etching away the second molybdenum metal layer in the partially retained region; and forming an aluminum oxide layer by oxidizing the aluminum metal layer in the opposite region using plasma containing O2.

7. The manufacturing method for the display substrate according to claim 6, wherein before the oxidizing the aluminum metal layer in the opposite region using plasma containing O2, the method further comprises:

performing conductor treatment on the active layer exposed after the gate insulating layer is dry etched.

8. The manufacturing method for the display substrate according to claim 5, wherein the patterning the photoresist layer comprises:

patterning the photoresist layer by using a half-tone mask, wherein the half-tone mask comprises: a completely light-transmitting region corresponding to the completely removed region, a partially light-transmitting region corresponding to the partially retained region, and a non-light-transmitting region corresponding to the completely retained region; and a light transmission amount of the partially light-transmitting region is 75%-85% of that of the completely light-transmitting region.

9. The manufacturing method for the display substrate according to claim 8, wherein the thickness of the photoresist layer is 2.0 µm to 2.2 µm, and the thickness of the photoresist pattern in the partially retained region is 0.3 µm to 0.5 µm.

10. The manufacturing method for the display substrate according to claim 6, wherein the dry etching the gate insulating layer comprises:

dry etching the gate insulating layer using a combined gas of O2 and CF4, wherein the flow of O2 is 1000 sccm to 1500 sccm, and the flow of CF4 is 2000 sccm to 2500 sccm.

\* \* \* \* \*